(12) United States Patent
Hübner

(10) Patent No.: US 6,709,949 B2
(45) Date of Patent: Mar. 23, 2004

(54) METHOD FOR ALIGNING STRUCTURES ON A SEMICONDUCTOR SUBSTRATE

(75) Inventor: Holger Hübner, Baldham (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/277,127

(22) Filed: Oct. 21, 2002

(65) Prior Publication Data

US 2003/0171008 A1 Sep. 11, 2003

Related U.S. Application Data

(63) Continuation of application No. PCT/EP01/03546, filed on Mar. 28, 2001.

(30) Foreign Application Priority Data

Apr. 19, 2000 (EP) .............................................. 00108561

(51) Int. Cl.[7] .............................................. H01L 21/76
(52) U.S. Cl. ....................... 438/401; 438/666; 438/668; 438/975
(58) Field of Search ................................ 438/401, 637, 438/666, 667, 668, 675, 975

(56) References Cited

U.S. PATENT DOCUMENTS

| 4,934,190 A | | 6/1990 | Lee | |
|---|---|---|---|---|
| 5,266,511 A | | 11/1993 | Takao | |
| 5,504,036 A | * | 4/1996 | Dekker et al. | 438/666 |
| 5,767,001 A | | 6/1998 | Bertagnolli et al. | |
| 5,767,011 A | * | 6/1998 | Yao et al. | 438/618 |
| 5,866,443 A | | 2/1999 | Pogge et al. | |
| 6,148,060 A | * | 11/2000 | Collins et al. | 378/65 |

FOREIGN PATENT DOCUMENTS

EP 0684643 A1 11/1995

OTHER PUBLICATIONS

Published International Application No. 98/19337 (Siniaguine), dated May 7, 1998.
"Vertically Integrated Circuits—A Key Technology For Future High Performance Systems", M. Engelhardt et al., CIP 97 Proceedings, Proc. 11th International Colloquium on Plasma Processes, Le Mans, France, pp. 187–192.

* cited by examiner

Primary Examiner—Kevin M. Picardat
(74) Attorney, Agent, or Firm—Laurence A. Greenberg; Werner H. Stemer; Ralph E. Locher

(57) ABSTRACT

In the three-dimensional integration of integrated circuits, a thinned semiconductor substrate is arranged on a second semiconductor substrate and is mechanically and electrically connected thereto. To that end, in the second, thinned semiconductor substrate, continuous contact holes are formed proceeding from a substrate rear side as far as a first metal wiring plane on a substrate front side. In order to align the contact holes with the structures arranged on the front side, a structure is arranged on the front side of the substrate, which can be used as an alignment mark on the front side. The structure is overgrown with a useful layer and uncovered proceeding from the rear side of the substrate, so that the structure can also be used as an alignment mark from the rear side. This avoids an alignment error between the structures arranged on the front side and the rear side.

4 Claims, 4 Drawing Sheets

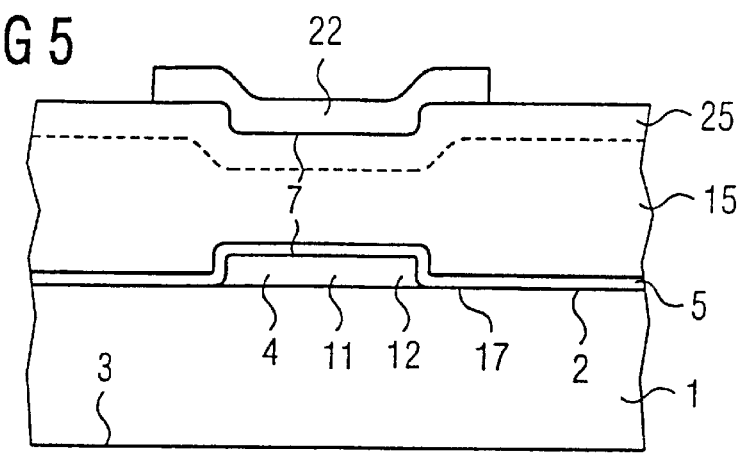
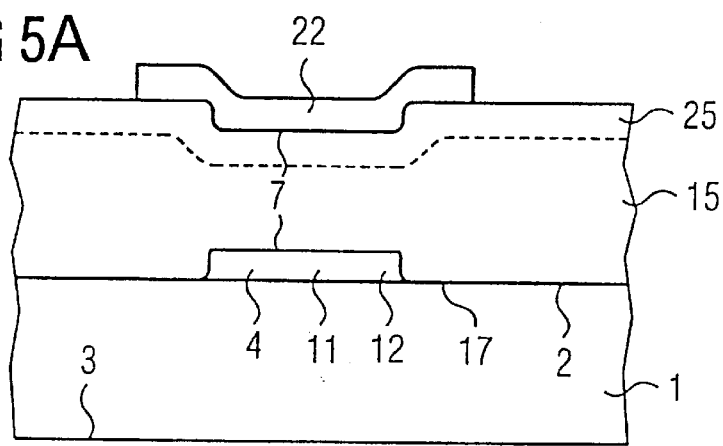
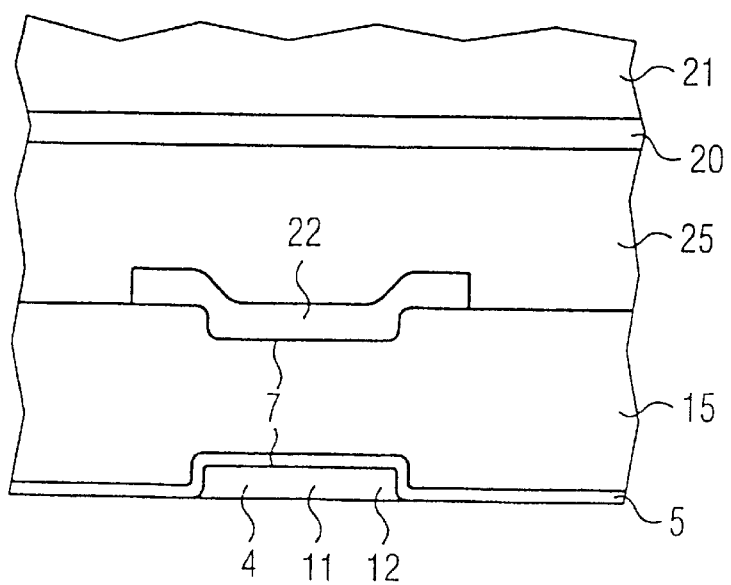

METHOD FOR ALIGNING STRUCTURES ON A SEMICONDUCTOR SUBSTRATE

CROSS-REFERENCE TO RELATED APPLICATION

This application is a continuation of copending International Application No. PCT/EP01/03546, filed Mar. 28, 2001, which designated the United States and was not published in English.

BACKGROUND OF THE INVENTION

Field of the Invention

The present invention relates to a method for aligning structures on the front side of a substrate and on the rear side of the substrate.

In the three-dimensional integration of integrated circuits, a thinned semiconductor substrate is arranged on a second semiconductor substrate and is mechanically and electrically connected thereto. This method is described, for example, in "Vertically Integrated Circuits—A Key Technology for Future High Performance Systems", M. Engelhardt et. al. from CIP '97 Proceedings, Proc. $11^{th}$ International Colloquium on Plasma Processes, page 187 (1997), and Supplément à la Revue Le Vide: science, technique et applications; No 284, April-May-June 1997, Editor: Société Francaise du Vide, 19 rue du Renard, 75004 Paris, France, on pages 187 to 192 (Supplementary Article to Revue Le Vide: Science, Techniques and Applications). In the method, the alignment and contact-connection of the semiconductor substrate is one of the technologically most demanding and most difficult process steps.

For the three-dimensional integration, it is customary first to provide two wafers having circuit sections that have already been processed. In this case, the first wafer serves as a carrier and the second wafer is thinned by the following method and is arranged on the first wafer. For thinning, first the front side of the second wafer is provided with an adhesive layer, and is connected to a mounting carrier. The front side is the side having the electrical circuits. The second wafer is then thinned from its rear side. In addition, contact hole openings are formed through the thinned substrate from the rear side as far as the first metal plane on the front side of the thinned wafer. Aligning the contact holes with respect to the contacts on the front side of the thinned substrate cannot be effected using the front side of the thinned substrate since the front side is concealed by the mounting carrier.

Therefore, the rear side of the second wafer is conventionally exposed using contact lithography. The alignment is effected using infrared exposure on marks that are arranged on the front side of the thinned wafer. In this case, the contact exposure, and particularly the infrared contact exposure, causes a large alignment error of typically +/−5 μm. Therefore, the contact regions on the front side of the thinned substrate are usually made very large. This means that valuable space on the front side of the substrate, which contains the electrical circuits, for example, is occupied by the large contacts.

SUMMARY OF THE INVENTION

It is accordingly an object of the invention to provide a method for aligning structures on a substrate front side and a substrate rear side which overcomes the above-mentioned disadvantages of the prior art methods of this general type.

In particular, it is an object of the invention to provide a method for aligning structures on a substrate front side and a substrate rear side which enables a significantly smaller alignment error.

With the foregoing and other objects in view there is provided, in accordance with the invention, a method for aligning structures on the front side of a substrate and on the rear side of the substrate, which is opposite the front side of the substrate. The method includes steps of: forming a structure on the front side of the substrate; overgrowing the structure with a useful layer; and uncovering the structure, proceeding from the rear side of the substrate.

The method includes first forming a structure on the front side of the substrate. Afterward, by way of example, further layers can be formed on the front side of the substrate. By way of example, electrical components and circuits are formed in the further layers. In this case, the structure on the front side of the substrate can be used for the alignment in a stepper, which carries out the exposure of a photoresist on the substrate front side. By way of example, by etching the rear side of the substrate, the structure which is used for patterning the substrate front side is uncovered on the substrate rear side, so that it can also be used on the substrate rear side as an alignment mark for a stepper in order to expose a photoresist on the substrate rear side for the processing of the substrate rear side. Since the structure is suitable for being used by a stepper, a contact exposure, which has a high alignment error, is no longer necessary. Equally, it is possible to dispense with the infrared exposure through the thinned wafer, which likewise reduces the alignment error.

One method step includes an alignment step using the structure uncovered on the rear side as an alignment mark. This advantageously enables the use of a stepper exposure instead of an infrared contact exposure, as a result of which the alignment error can be significantly reduced.

A further method step includes an alignment step using the structure on the front side of the substrate as an alignment mark. The advantage of this method step is that both the structures formed on the substrate front side and the structures formed on the substrate rear side can be aligned with the same structure. As a result, it is possible to avoid a misalignment between the process and exposure steps carried out on the substrate front side and the process and exposure steps carried out on the substrate rear side.

A further method step includes using the structure as an etching mask while etching the rear side. The use of the structure as an etching mask advantageously makes it possible to carry out a self-aligned etching process on the substrate rear side.

One method variant includes forming the structure as a trench in the front side of the substrate. The advantage of this configuration is that a trench in a substrate surface can be used as an alignment mark by a stepper.

A further method variant includes forming the structure as an elevation on the front side of the substrate. An elevation on the substrate front side is suitable for serving as an alignment mark for a stepper. In this case, the elevation can be formed from the same material as the substrate or else from a different material.

If the structure is formed from a different material than the substrate, then the different material can be sunk in the substrate front side and the substrate surface can be planarized.

Furthermore, a doped layer can be formed in the substrate. In this case, the doped layer has the task of serving as an etching stop during the etching of the substrate rear side. The doped layer is advantageously formed in such a way that it acquires the topographic contour of the structure. As a result, it is possible for both the processing on the substrate front side and the processing on the substrate rear side to be aligned with the same structure.

Furthermore, the rear side of the substrate can be etched chemically, during which the substrate is thinned, the doped layer is used as an etching stop, and the structure is formed on the rear side.

In a further method variant, in addition to the structure that is uncovered on the rear side a second trench is formed, which is filled with a mask material. The advantage of this method step is that a mask material can be arranged in a self-aligned manner with respect to the structure formed on the rear side without additional photolithographic exposure steps. The mask material can be used as an etching mask in a subsequent etching step.

In a further method step, the second trench is filled with the mask material by depositing the mask material on the rear side of the substrate and then planarizing. This method step has the advantage that the mask material is introduced into the second trench and forms a self-aligned etching mask, without requiring an additional lithographic exposure step.

A further method step includes using the mask material as an etching mask during the patterning of the rear side. This process step makes it possible, by way of example, to etch contact holes from the substrate rear side to the substrate front side, which are aligned there with corresponding contact areas.

The structure is formed from a mask material and is used as an etching mask for patterning the rear side—a third trench being formed in addition to the structure. In this method step, the structure on the front side of the substrate is formed from a mask material. The structure, and accordingly, the mask material is uncovered during the etching of the substrate rear side. In a further substrate rear-side etching step, the structure is then used as an etching mask, and a trench is formed in addition to the structure. The advantage of this procedure is that a subsequent lithographic step on the substrate rear side can be aligned with the structure.

A further method step includes filling the third trench with a second mask material and removing the structure from the rear side. The advantage of this method step is that a second mask is formed in addition to the structure. The second mask can then be used as an etching mask in a subsequent etching step in order to etch that region of the substrate rear side that was formerly occupied by the structure, for example, to etch a contact hole as far as the front side of the substrate.

A further advantageous configuration of the method includes filling the third trench with a second mask material and removing the structure from the rear side. This procedure has the advantage that the rear side originally occupied by the structure can be patterned by an etching process in order to form, by way of example, a contact hole to the front side of the substrate.

Furthermore, the second mask material in the third trench can be used as an etching mask during the patterning of the rear side. The use of the second mask material as an etching mask likewise enables an etching process that is self-aligned with respect to the structure, since the third trench and thus the second mask material were formed in a self-aligned manner with respect to the structure.

A further method step includes growing the doped layer on the front side of the substrate. The growth of the doped layer has the advantage that the structure on the front side of the substrate is encapsulated conformally with the doped layer, so that the doped layer has a topography corresponding to the structure.

A further method variant includes forming the first doped layer by implanting dopant in the substrate. The implantation of dopant has the advantage that the doped layer can be introduced conformally with respect to the structure.

A further method variant includes growing a useful layer on the doped layer. The useful layer can be used for example for the formation of circuits or structures.

Furthermore, a circuit can be formed on the front side of the substrate.

One method variant includes growing the useful layer on the front side of the substrate. The useful layer is grown on the structure with a different growth rate or morphology than on the substrate surface. The advantage of this procedure is that a structure formed as an elevation is formed as a depression on the top side of the useful layer.

A further method step includes removing the structure from the front side of the substrate, as a result of which the doped layer is patterned. If the structure is formed as an elevation, for example, and the doped layer is subsequently formed, then by removing the elevation it is possible for the doped layer to be concomitantly removed in the region of the elevation. As a result, it is possible, for example, to form a window in the doped layer.

A further method variant includes etching the rear side of the substrate and using the patterned doped layer as an etching stop—with a fourth trench being formed in the rear side of the substrate in a region in which the doped layer has a mask window. The advantage of this method variant is that the patterned doped layer has a mask window in which a trench can be formed by using a suitable etching step.

Other features which are considered as characteristic for the invention are set forth in the appended claims.

Although the invention is illustrated and described herein as embodied in a method for aligning structures on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 shows a further configuration of the substrate in which the structure has been formed as an elevation;

FIG. 5A shows the substrate of FIG. 5, but without the optional doped layer; and FIGS. 6, 7 and 8 show a substrate obtained after performing further process steps with the structure illustrated in FIG. 5 or 5A.

DESCRIPTION OF THE PREFERRED EMBODIMENTS

Figure 1:
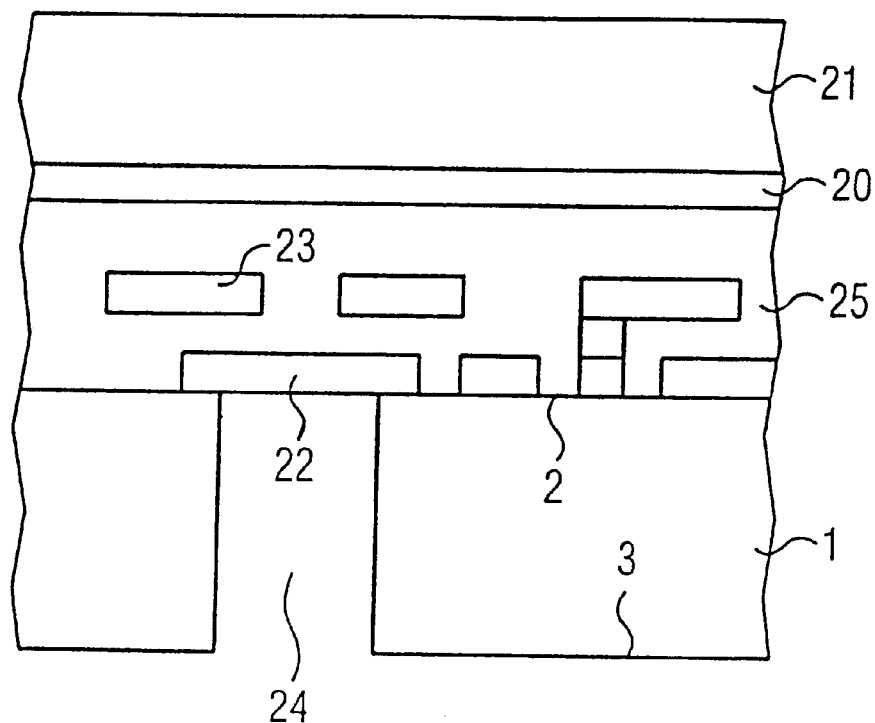
FIG. 1 shows a thinned substrate with a contact hole that reaches from the rear side of the substrate to the first metallization plane.

Referring now to the figures of the drawing in detail and first, particularly, to FIG. 1 thereof, there is shown a thinned substrate 1, on which an insulation layer 25 is arranged. By way of example, a first metallization plane 22 and a second metallization plane 23 are situated in the insulation layer 25. Furthermore, a contact hole 24 is formed from the rear side 3 of the substrate 1 as far as the front side 2 of the substrate 1, and the first metallization plane 22 is uncovered from the rear side in a contact region. The insulation layer 25 is fixed to a mounting carrier 21 using an adhesive layer 20. Fixing the substrate 1 to the mounting carrier 21 enables the substrate 1 to be thinned from the rear side 3 before the contact hole 24 is formed.

Figure 2:
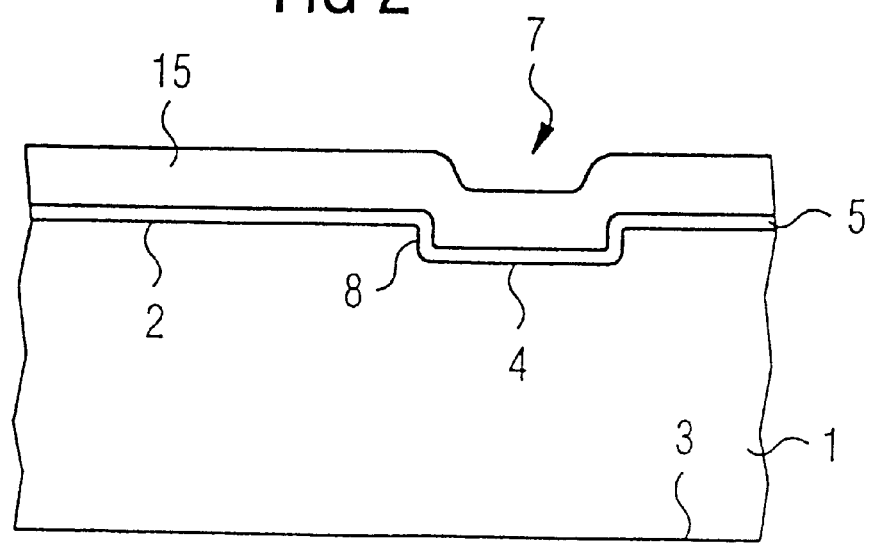
FIG. 2 shows a substrate with a structure.
Figure 3:
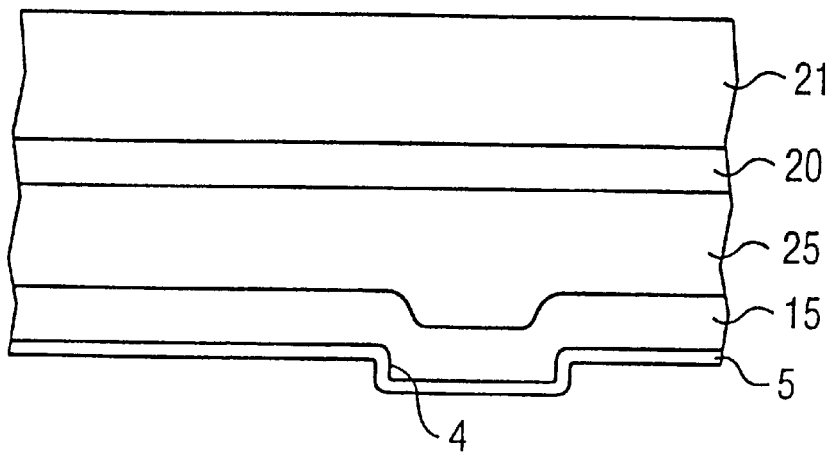
FIG. 3 shows the substrate from FIG. 2 after being thinned.
Figure 4:
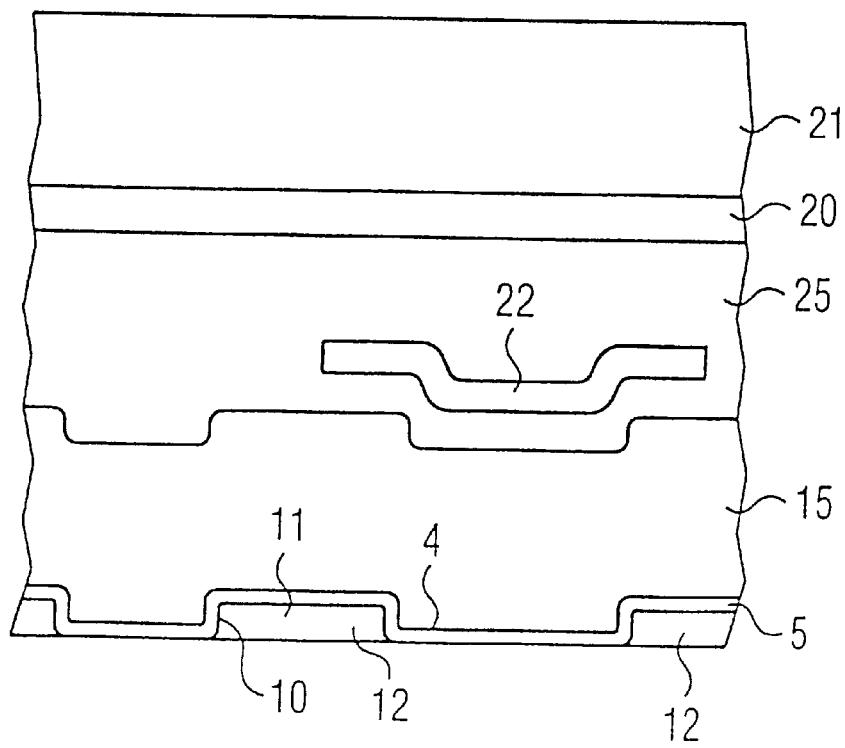
FIG. 4 shows a further configuration of the substrate of FIG. 3.

FIGS. 2 to 4 are used to describe a production method for an alignment mark 7, which can be used, both proceeding from the substrate front side 2 and from the substrate rear side 3, for aligning structures on the substrate 1 using lithographic processes.

FIG. 2 illustrates an unthinned substrate 1 having a front side 2 and a rear side 3. A structure 4 is introduced in the front side 2 of the substrate 1 as a trench 8. The structure 4 can be used as an alignment mark 7 from the front side. A doped layer 5 is arranged on the front side 2 of the substrate 1 and in the trench 8. A useful layer 15 is situated on the doped layer 5. In this exemplary embodiment, the substrate 1 is formed from silicon. The structure 4 is formed by a stepper exposure step with a subsequent trench etching. The doped layer 5 is formed by an epitaxial growth method, for example. The useful layer 15, which can likewise be formed by an epitaxial growth method, is grown on the doped layer 5. By way of example, a circuit arrangement using CMOS technology can be formed on the useful layer 15. The growth of the useful layer 15 is a conformal deposition process, for example, so that the structure 4 is transferred to the useful layer 15 and can thus be used as an alignment mark 7 for a stepper.

A further method variant that is suitable for producing the structure illustrated in FIG. 2 includes first etching a trench 8 into the front side 2 of the substrate 1 and introducing the doped layer 5 into the substrate 1 using an implantation. In this production method, too, the doped layer 5 is formed as a buried layer, so that a useful layer 15 with a doping that deviates from the doped layer 5 is arranged above the doped layer 5.

With reference to FIG. 3, on the useful layer 15, in which, for example, field-effect transistors are arranged, there is an insulation layer 25, in which, for example, a metal wiring for the field-effect transistors is arranged. The insulation layer 25 is fixed to a mounting carrier 21 by an adhesive layer 20. The substrate 1 is ground and etched wet-chemically from its rear side 3, and the etching stops selectively on the doped layer 5. Since the doped layer 5 acts as an etching stop, the structure 4 forms on the rear side 3 of the substrate 1. The structure 4 can be used as an alignment mark by a stepper in a photolithographic process on the rear side 3. As a result, it is possible to position a contact hole relative to the alignment mark 7 with a high precision that is not achieved by an infrared contact exposer.

With reference to FIG. 4, a self-aligned process is additionally possible, which can be used to form a contact hole in a self-aligned manner from the rear side 3 of the substrate 1 to the first metal plane 22 without further lithographic patterning. FIG. 4 illustrates the useful layer 15, on which is situated an insulation layer 25, in which, for example, the first metal plane 22 is arranged. In order to be able to grind away and etch the rear side 3, this arrangement is fixed to a mounting carrier 21 by an adhesive layer 20. Furthermore, the doped layer 5 is arranged on the rear side of the useful layer 15. By using the rear-side etching process, the rear side 3 is removed as far as the doped layer 5. As a result of etching the rear side 3 of the substrate 1, a second trench 10 is formed in addition to the structure 4, and is filled with a mask material 11 used as an etching mask 12. The filling process can be carried out, for example, by a whole-area deposition of silicon dioxide with a subsequent planarization by using a CMP (chemical mechanical polishing) process step. Possible deposition methods for silicon oxide are CVD (chemical vapor deposition) methods. The etching mask 12 can then be used as a mask for etching the uncovered doped layer 5 and the overlying useful layer 15. It is possible to etch a contact hole from the rear side 3 as far as the first metal plane 22.

A further method for fabricating a structure 4 that can be used as an alignment mark is described with reference to FIGS. 5 to 8. FIG. 5 illustrates a substrate 1 with a substrate front side 2 and a substrate rear side 3. On the front side 2 of the substrate 1, a structure 4 is formed as an elevation made of a mask material 11. The structure 4 serves as an alignment mark 7 in an exposure step with a stepper. A doped layer 5 is arranged on the front side 2 of the substrate 1. In this exemplary embodiment, the doped layer 5 is arranged conformally on the substrate surface 17 and the structure 4. The doped layer 5 is optional and can be omitted, which is illustrated in FIG. 5A. Arranged on the doped layer 5 is a useful layer 15, on which an insulation layer 25 is situated. A first metal plane 22 is arranged above the insulation layer 25. In order to fabricate the structure illustrated in FIG. 5, by way of example, a substrate 1 made of silicon is provided. A layer made of a mask material 11 is deposited onto the whole area of the substrate surface 17 of the substrate 1 and is patterned, thereby forming the alignment mark 7 on the substrate surface 17.

It is likewise possible to configure the alignment mark 7 as a structure 4 by etching a trench into the substrate surface 17, which trench is filled with the mask material 11 and is subsequently planarized to the level of the substrate surface 17. In this case, the alignment mark 7 is sunk into the substrate surface 17.

The doped layer 5 can subsequently be formed by a deposition method. This deposition method may be, for example, an epitaxial deposition method or an implantation. The epitaxy continues the monocrystallinity of the substrate 1 only at the substrate surface 17 and forms a polycrystalline doped layer 5 on the alignment mark 7, which is formed from the mask material 11. Provision may likewise be made here for the doped layer 5 to grow only on the substrate surface 17 and not on the mask material 11, so that a selective epitaxy is carried out. A useful layer 15 is subsequently ground epitaxially. Here, too, the monocrystallinity of the useful layer 15 continues above the substrate surface 17 and the growth above the mask material 11 is polycrystalline. The epitaxy can be set in such a way that it is carried out selectively, with the epitaxy above the mask material 11 growing significantly more slowly, so that the structure 4 at the surface of the useful layer 15 is formed as a trench that can be used as an alignment mark 7.

With reference to FIG. 6, the substrate is fixed to a mounting carrier 21. The substrate 1 has been thinned from its rear side 3, so that, through the etching process, the rear-side etching stops in a self-aligned manner on the doped layer 5. Furthermore, the rear-side etching also stops on the mask material 11. For the case where the optional doped layer 5 is not arranged in the substrate 1, the rear side 3 of the substrate 1 is removed, for example, by time-controlled grinding processes and time-controlled etching processes, so that the thinning of the substrate 1 is ended upon reaching the desired residual thickness of the substrate 1.

Figure 7:
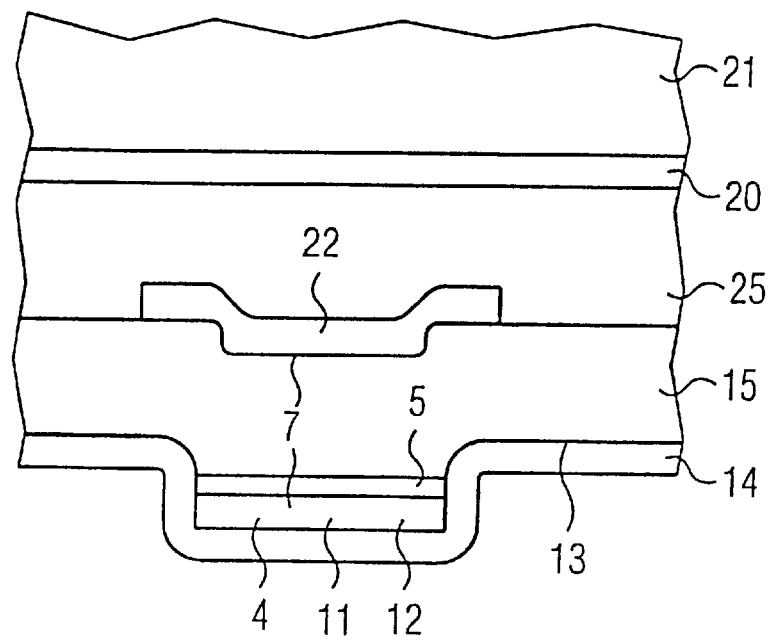

With a subsequent reactive ion etching step that etches the silicon of the doped layer 5 and of the useful layer 15, the structure 4 that is formed from silicon oxide in this case, can be used as an etching mask. This etching can likewise be carried out wet-chemically. During the etching process, the silicon arranged beside the structure 4 is etched, thereby producing a third trench 13. Afterward, a conformal or a planarizing deposition is carried out, which deposits a second mask material 14 on the rear side 3. During the deposition operation, the third trench 13 is filled with the second mask material 14 as shown in FIG. 7.

Figure 8:
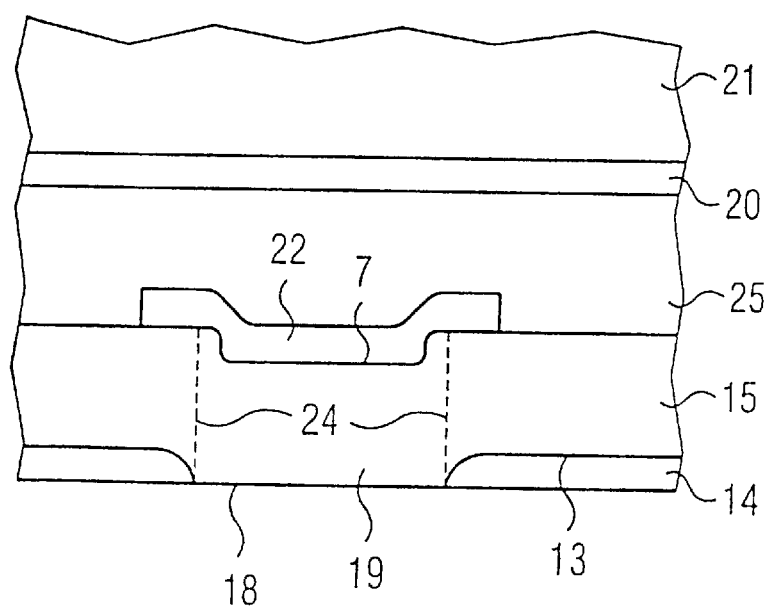

With reference to FIG. 8, a planarization step is subsequently carried out, during which the rear side 3 is planarized. The second mask material 14, the structure 4 and the doped layer 5 are removed and a region 18 is uncovered. In a subsequent etching process, the second mask material 14, arranged in the third trench 13, is used as an etching mask during the etching of the useful layer 15 in the uncovered region 18. In this case, by way of example, a fourth trench 19 is etched which serves as a contact hole 24 and uncovers the first metal plane 22.

In the method specified, the doped layer 5 is formed, for example, with a p-type dopant, and boron is used for this purpose. The etching mask 12 and the second mask material 14 may be formed from silicon oxide or silicon nitride, for example. If the structure 4 is formed from a material that is different from the substrate 1, then e.g. silicon oxide or silicon nitride or titanium nitride may be used for the structure 4.

If the substrate 1 is thinned to a very great extent then it can warp on account of internal stresses. In this case, photolithography aligned with the thinned substrate 1 can cause misalignment with the structures formed in the substrate 1 despite the alignment with suitable alignment marks. For this reason, it is particularly advantageous to carry out the etching of the rear side 3 of the substrate 1 in a self-aligned manner using self-aligned etching masks, in order that the structures are produced at the suitable positions of the substrate 1.

I claim:

1. A method for aligning structures on a front side of a substrate and on a rear side of the substrate being opposite to the front side of the substrate, the method which comprises:

forming a trench or depression on the front side of the substrate;

growing a doped semiconductor layer on the front side of the substrate;

forming a circuit configuration on the front side of the substrate;

removing substrate material from the back side of the substrate up to the doped semiconductor layer to reproduce the trench or depression on the back side of the substrate; and using the trench or depression on the back side of the substrate as an alignment mark or for forming an etching mask.

2. The method according to claim 1, which further comprises:

forming a contact pad in the trench or depression; and using the trench or depression on the back side of the substrate to form a mask with an opening opposite the contact pad.

3. A method for aligning structures on a front side of a substrate and on a rear side of the substrate being opposite to the front side of the substrate, the method which comprises:

applying a structured first mask layer to the front side of the substrate;

growing a doped semiconductor layer on the front side of the substrate;

growing a further semiconductor layer reproducing a structure of the first mask layer in an inverted form; and removing substrate material from the back side of the substrate up to the first mask layer and the doped semiconductor layer.

4. The method according to claim 2, which further comprises:

selectively removing additional semiconductor material with respect to the first mask layer;

applying a second mask layer to the back side of the substrate; and planarizing the back side of the substrate to remove the first mask layer.

* * * * *

UNITED STATES PATENT AND TRADEMARK OFFICE
CERTIFICATE OF CORRECTION

PATENT NO. : 6,709,949 B2
DATED : March 23, 2004
INVENTOR(S) : Holger Hübner

It is certified that error appears in the above-identified patent and that said Letters Patent is hereby corrected as shown below:

<u>Column 8,</u>
Line 39, should read as follows:
-- The method according to claim 3, which further com- --

Signed and Sealed this

Twenty-sixth Day of July, 2005

JON W. DUDAS
*Director of the United States Patent and Trademark Office*